(12) United States Patent
Mori et al.

(10) Patent No.: US 7,616,694 B2
(45) Date of Patent: Nov. 10, 2009

(54) NOISE FREE TRANSCEIVER CIRCUIT

(75) Inventors: Masaki Mori, Nukata-gun (JP); Tadatoshi Asada, Anjo (JP); Susumu Ueda, Okazaki (JP); Hirokazu Toyoda, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 369 days.

(21) Appl. No.: 11/653,421

(22) Filed: Jan. 16, 2007

(65) Prior Publication Data

US 2007/0206685 A1    Sep. 6, 2007

(30) Foreign Application Priority Data

Jan. 17, 2006  (JP) .............................. 2006-008634
Aug. 11, 2006  (JP) .............................. 2006-219307

(51) Int. Cl.
  *H04B 3/00*  (2006.01)
(52) U.S. Cl. ........................ 375/257; 375/256; 375/219
(58) Field of Classification Search .................. 375/257, 375/256, 219
  See application file for complete search history.

(56) References Cited

U.S. PATENT DOCUMENTS

| 4,320,521 | A | * | 3/1982 | Balakrishnan et al. ...... 375/257 |
| 4,896,333 | A | * | 1/1990 | Can ........................... 375/219 |
| 4,988,958 | A | * | 1/1991 | Tsuruoka et al. ............ 331/111 |
| 6,269,388 | B1 | * | 7/2001 | Pioppo ....................... 708/852 |
| 6,518,803 | B2 | * | 2/2003 | Nagata et al. ............... 327/108 |
| 7,221,224 | B2 | * | 5/2007 | Koyasu ...................... 330/252 |
| 7,248,634 | B2 | * | 7/2007 | Koyasu ...................... 375/256 |
| 2004/0141560 | A1 | | 7/2004 | Koyasu |

* cited by examiner

*Primary Examiner*—Vibol Tan
(74) *Attorney, Agent, or Firm*—Posz Law Group, PLC

(57) ABSTRACT

A noise free transceiver circuit includes a communication line, a power source line, a ground line, an output transistor having output terminals connected between the communication line and the ground line for outputting a communication signal to the communication line, a first circuit for applying a trapezoidal signal to the input terminal of the output transistor to turn on in synchronism with a transmission signal and a second circuit for turning off the output transistor when the level of the transmission signal is high. The output transistor is turned off when the communication signal is outputted. Therefore, noises of the power line are shut out of the output transistor.

4 Claims, 6 Drawing Sheets

NOISE FREE TRANSCEIVER CIRCUIT

CROSS REFERENCE TO RELATED APPLICATION

The present application is based on and claims priority from Japanese Patent Applications 2006-8634, filed Jan. 17, 2006 and 2006-219307, filed Aug. 11, 2006, the contents of which are incorporated herein by reference.

BACKGROUND OF THE INVENTION

1. Field of the Invention

The present invention relates to a transceiver circuit for driving a signal-outputting power transistor that is connected between a communication line and a ground.

2. Description of the Related Art

JP 2004-289597A2 or its counterpart U.S. Patent application U.S. 2004/0141560A1 discloses an integrated circuit for a vehicle network transceiver that includes a transceiver IC 10, in which an output transistor 1 is mounted, as shown in FIG. 6. The output transistor 1 is supplied with a driving signal of a trapezoidal wave-form to output a signal to a communication line 3 in order to suppress noises that are generated due to an abrupt signal change. The communication line 3 is connected with an outside control circuit 2 and with a receiving side power supply line via a series circuit of a resistor 4 and a diode 5. The output transistor 1 is always biased by a constant current circuit 9 to output a low level signal at an input/output terminal 7 when the level of a transmission signal is low. When the level of the transmission signal is high, the trapezoidal signal is applied to the base of the transistor 1 to output a high level signal. Therefore, the output transistor 1 is still active and turned on.

In case the vehicle network transceiver has a common communication line 3 for both signal transmitting and signal receiving, it is not possible to suppress the noise if a noise gets into the output transistor 1 via a receiving side power line 6 and the series circuit of the resistor 4 and the diode 5. Further, the disclosed transceiver IC 10 can not control voltage fluctuation of a power supply line in the case that the transceiver IC 10 is mounted in a vehicle alternator or the like that generates ripple voltage.

SUMMARY OF THE INVENTION

Therefore, an object of the invention is to provide an improved transistor driving circuit that is free from the above stated problem.

According to a feature of the invention, a transceiver circuit includes an output transistor having an emitter-collector path connected between a communication line and a ground line, a trapezoidal wave signal circuit for providing a trapezoidal signal in synchronism a transmission signal, a driving circuit having an input terminal connected with the trapezoidal wave signal circuit and an output terminal connected with the base of the output transistor for driving the output transistor in response to the trapezoidal wave signal, and a control circuit for controlling the driving circuit to turn off the output transistor when the level of the transmission signal is high.

If noises get on a power line or the like to which the output transistor is connected, the output transistor will not erroneously operate, as it turns off while a communication signal is outputted.

In the above transceiver circuit, the driving circuit may include a current mirror circuit having a pair of transistors one of which is connected to the base of the output transistor and the other of which is connected to the control circuit, so that the one of the transistor turns off to turn off the output transistor when the control circuit controls the driving circuit. The control circuit may include a current mirror circuit having a pair of transistors and a switching transistor for switching on one of the pair of transistors when the level of the transmission signal is high.

In this transceiver circuit, the control circuit may further include a circuit for supplying current to transfer the output transistor from a saturation region to an active region when it turns off and current to transfer the output transistor from the active region to the saturation region when it turns on, whereby the output transistor operates according to the transmission signal without delay.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

Some preferred embodiments according to the present invention will be described with reference to the appended drawings.

A transceiver circuit for signal communication according to the first embodiment of the invention will be described with reference to FIGS. 1-2. Incidentally, the signal communication is based on LIN (local interconnect network), as the communication protocol thereof.

Figure 1:
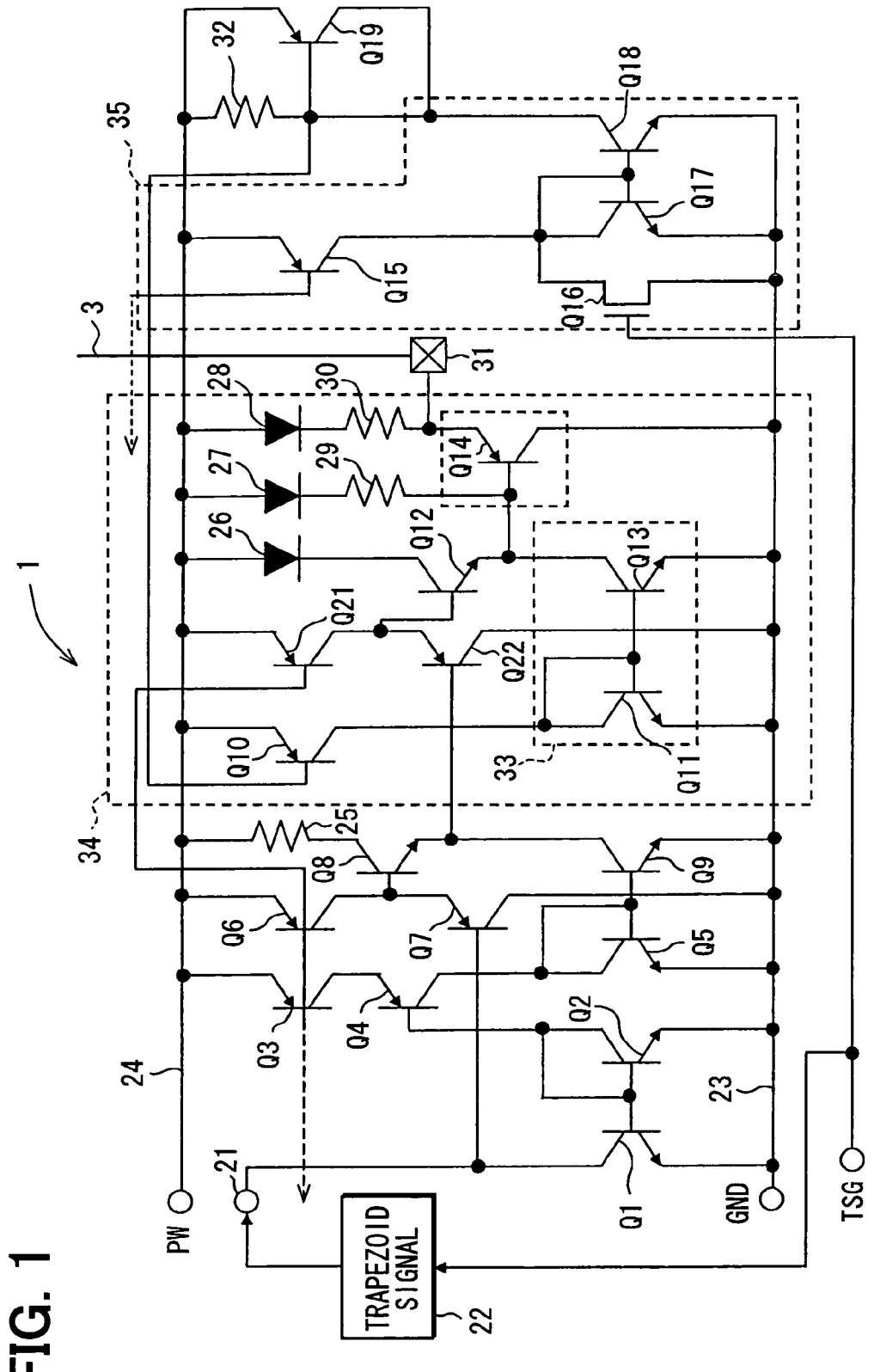
FIG. 1 is a circuit diagram of a transceiver IC of a transceiver circuit according to the first embodiment of the invention.
Figure 2:
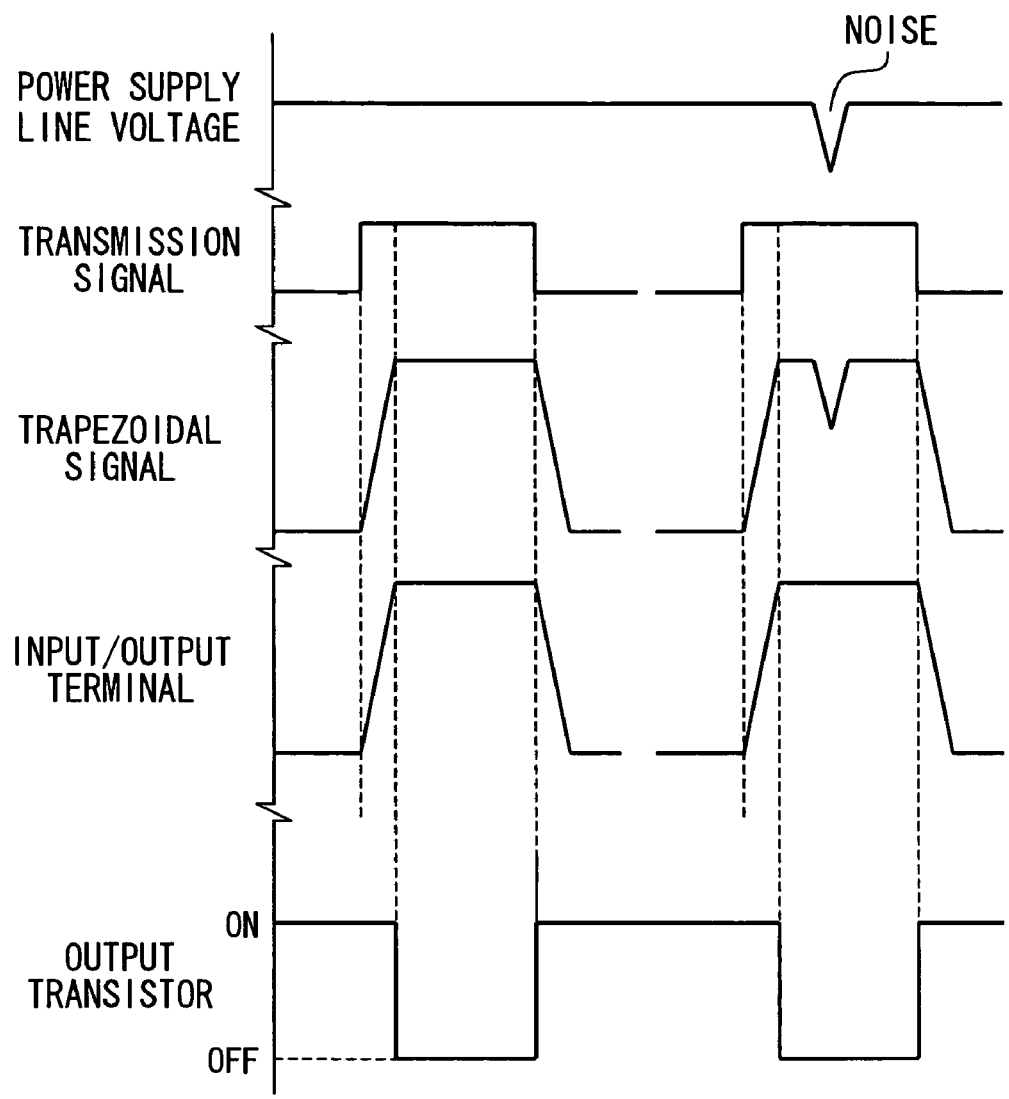
FIG. 2 is a timing diagram of signals at main portions of the transceiver IC when a noise is applied to the transceiver IC.

As shown in FIG. 1, the transceiver circuit includes a transceiver IC 1, a communication line 3 and a common trapezoidal signal circuit 22, such as disclosed in JP-A-2002-152015.

The transceiver IC 1 includes a power terminal PW, a transmission signal input terminal TSG, a ground terminal GRD, a pair of NPN transistors Q1, Q2, a series circuit of PNP transistors Q3, Q4, an NPN transistor Q5, a series circuit of PNP transistor Q6, Q7, a series circuit of NPN transistors Q8, Q9, a series circuit of PNP transistor Q10 and an NPN transistor Q11, a series circuit of NPN transistors Q12, Q13, an output transistor Q14, a series circuit of PNP transistors Q15, Q17, an N-channel MOSFET Q16, a pair of NPN transistors Q17, Q18, a PNP transistor 19, a series circuit of PNP transistors Q21, Q22, a trapezoidal signal input terminal 21, a ground line 23, a transmitter side power supply line 24, a resistor 25, diodes 26, 27, 28, resistors 29, 30, an input/output terminal 31, a resistor 32, etc.

Each of the NPN transistors Q1, Q2 has an emitter connected with the ground line (GND) 23 and a base connected with the collector of the transistor Q2, so that the pair forms a current mirror circuit. The collector of the transistor Q1 is connected to the input terminal 21. The collector of the transistor Q2 is connected to the base of the PNP transistor Q4, whose collector is connected with the collector of the NPN transistor Q5. Each of the NPN transistors Q5, Q9 has an emitter connected with a ground line (GND) 23 and a base connected with the collector of the transistor Q5, so that the pair of transistors Q5, Q9 also forms a current mirror circuit. The PNP transistor Q4 has an emitter connected with the transmitter side power supply line 24. The series circuit of the transistor Q6, Q7 is connected between the power supply line 24 and the ground line 23. The base of each of the PNP transistors Q3, Q6 is connected to the base of a transistor that forms a mirror circuit (not shown), and the base of the PNP transistor Q7 is connected with the input terminal 21.

The NPN transistor Q8 has a collector connected via the resistor 25 with the transmitter side power supply line 24, a base connected to the emitter of the NPN transistor Q7 and an emitter connected with the collector of the NPN transistor Q9. Each of NPN transistor Q11 and the NPN transistor Q13 has an emitter connected with the ground line 23, a base connected with the collector of the transistor Q11, so that the transistors Q11, Q13 form a current mirror circuit. The series circuit of the PNP transistor Q10 and the NPN transistor Q11 is connected between the ground line 23 and the power supply line 24. The series circuit of the PNP transistors Q21, Q22 is also connected between the power supply line 23 and the ground line 24. The transistor Q21 has a base connected with the bases of the transistors Q3, Q6, and the transistor Q22 has a base connected with the emitter of the transistor Q8.

The anode of each of the diodes 26, 27, 28 is connected to the power supply line 24. The cathode of the diode 26 is connected to the collector of the NPN transistor Q12, whose emitter is connected with the base of the output transistor Q14 and the collector of the transistor Q13. The base of the transistor Q12 is connected with the emitter of the transistor Q22 and the collector of the transistor Q21.

The cathode of the diode 27 is connected via the resistor 29 with the base of the output transistor Q14, and the cathode of the diode 28 is connected via the resistor 30 with the emitter of the output transistor Q14. The collector of the output transistor Q14 is connected with the ground line 23, and the emitter thereof is connected with the input/output terminal 31, which is connected with the common communication line 3.

Each of the NPN transistors Q17, Q18 has an emitter connected with the ground line (GND) 23 and a base connected with the collector of the transistor Q17, so that the pair of the NPN transistors Q17, Q18 forms a current mirror circuit. The transistor Q17 has a collector connected with the power supply line 24 via the collector-emitter path of the transistor Q15, and the collector of the transistor Q18 is connected with the power supply line 24 via a parallel circuit of the resistor 32 and the emitter-collector path of the transistor Q19.

The MOSFET Q16 is connected in parallel with the emitter-collector path of the transistor Q17 to function as a switching transistor. The MOSFET Q16 has a gate to which a transmission signal is applied via the signal terminal TSG from a signal transmission circuit (not shown). The base of the transistor Q21 is connected with the base of a transistor of a mirror circuit (not shown), and the base of the transistor Q19 is connected with the base of the transistor 10.

In the above transceiver IC 1, the pair of the transistors Q11, Q13 form an output-transistor-controlling mirror circuit 33, the transistors Q10-Q14, Q21 and Q22 form a driving circuit 34, and the transistors Q15-Q18 form a driving-circuit-controlling constant current circuit 35.

When a low level transmission signal is applied to the terminal TSG, the switching MOSFET Q16 of the driving-circuit-controlling constant current circuit 35 turns off, so that the transistor Q18 of the constant current circuit 35 turns on to pass a constant amount of current. Consequently, the transistor Q10 of the driving circuit 34 turns on to turn on the transistor Q13 of the output-transistor-controlling current mirror circuit 33, so that the output transistor Q14 turns on to make the voltage level of the input/output terminal 31 low.

When, on the other hand, a high level transmission signal is applied to the terminal TSG, the switching MOSFET Q16 of the driving-circuit-controlling constant current circuit 35 turns on, so that the transistor Q18 of the circuit 35 turns off. Consequently, the transistor Q10 of the driving circuit 34 turns off to turn off the transistor Q13 of the output-transistor-controlling current mirror circuit 33, so that the output transistor Q14 turns off to make the voltage level of the input/output terminal 31 high.

In the meantime, the transistors Q1, Q2 of the current mirror circuit and the transistors Q5, Q9 of another current mirror circuit are always turned on. The potential of the collector of the transistor Q1 is transmitted to the base of the output transistor Q14 via the transistor Q7, Q8 and Q22 and Q12 of the driving circuit 34, so that the potential curve of the collector of the output transistor Q14 becomes similar to the potential curve of the base of the transistor Q7 to which the trapezoidal wave-form signal is applied by the trapezoidal signal circuit 22 via the terminal 21, as shown in FIG. 2.

When the transmission signal changes from the low level to the high level, the transistor Q18 of the constant current circuit 35 turns off to turn off the transistor Q10. Consequently, the trapezoidal signal circuit 22 supplies a trapezoidal signal in synchronism with the change of the transmission signal to the base of the transistor Q7, which provide a voltage signal. This voltage signal is transmitted to the base of the output transistor Q14, so that the input/output terminal 31 provides an output signal of the same wave-form as the voltage signal of the transistor Q7.

If a noise gets into the power line 24 when the level of the transmission signal is high during signal transmission, the input/output terminal can be prevented from any trouble caused by the noise because the output transistor is turned off.

In other words, when the transceiver IC 1 provides a high level signal on the communication line 3, the constant current circuit 35 controls the driving circuit 34 to turn off the output transistor Q14. Even if a noise gets into the transmitter side power supply line 24, the output transistor Q14 can be prevented from being driven by the noise. Therefore, the transceiver IC 1 can be mounted on a portion near an alternator, where many noises and ripples are generated.

A transceiver circuit for signal communication according to the second embodiment of the invention will be described with reference to FIGS. 3 and 4. Incidentally, the same reference numeral as the previous embodiment represents the same or substantially the same portion, part or component as the previous embodiment, and only those of which are different are described hereafter.

Figure 3:
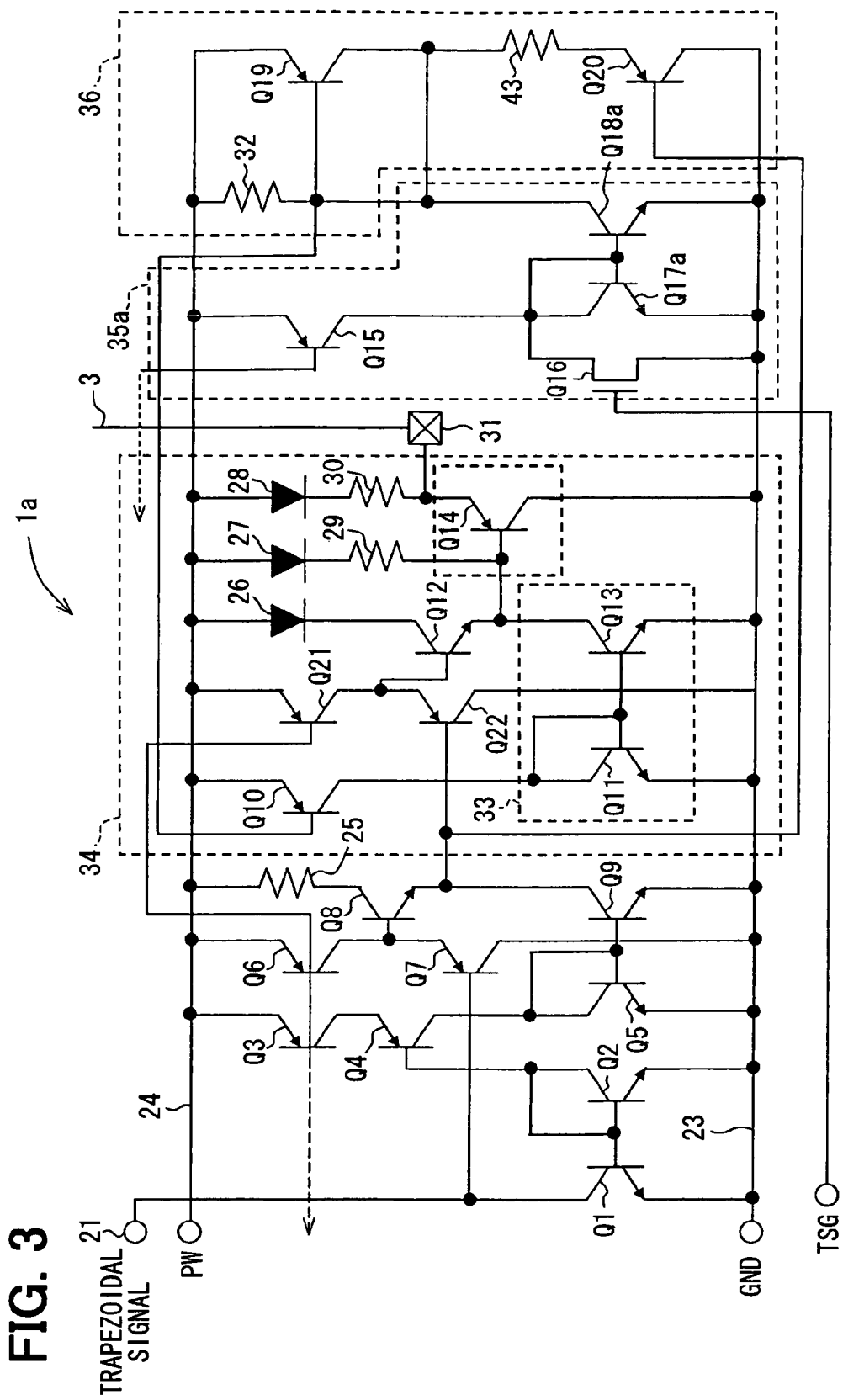
FIG. 3 is a circuit diagram of a transceiver IC of a transceiver circuit according to the second embodiment of the invention.

As shown in FIG. 3, the transceiver circuit includes a transceiver IC 1a, a communication line 3 and the common trapezoidal signal circuit 22 (which is shown in FIG. 1).

The transceiver IC 1a is the same in structure as the first embodiment except that the driving-circuit-controlling constant current circuit 35 is replaced by a constant current circuit 35a and that the circuit comprised of transistor Q19 and the resistor 32 is replaced with a trapezoidal wave-form constant current circuit 36.

The driving-circuit-controlling constant current circuit 35a includes a mirror circuit comprised of a pair of transistors Q17a, Q18a that conducts an amount (e.g. several-ten μA) of the current of about 1/100 of the amount (e.g. several mA) conducted by the transistors Q17, Q18 of the first embodiment.

The trapezoidal wave-form constant current circuit 36 includes the same transistor Q19, the same resistor 32 and a resistor 43 and a PNP transistor Q20. The collector of the transistor Q19 is connected with the ground line via the resistor 43 and the emitter-collector path of the transistor Q20. The base of the transistor Q20 is connected to the emitter of the transistor Q8. The trapezoidal wave-form constant current circuit 36 provides the same amount of constant current as the constant current circuit 35 of the first embodiment.

When the transmission signal changes from the low level to the high level and from the high level to the low level, the input/output terminal 31 outputs signals of the same wave shape in the same manner as the first embodiment.

When the level of the trapezoidal wave-form signal is low, the transistor Q20 turns on, so that the transistor Q10 is supplied with the constant base current of several m A. The amount of the base current increases at the same rising angle as the trapezoidal wave-form signal and decreases at the same falling angle as the trapezoidal wave-form signal.

Therefore, the period in which the level of the transmission signal is high, the amount of the base current of the transistor Q10 is the composite of the small amount of the constant current supplied by the constant current circuit 35a and the constant current supplied by the trapezoidal wave-form constant current circuit 36.

Figure 4:
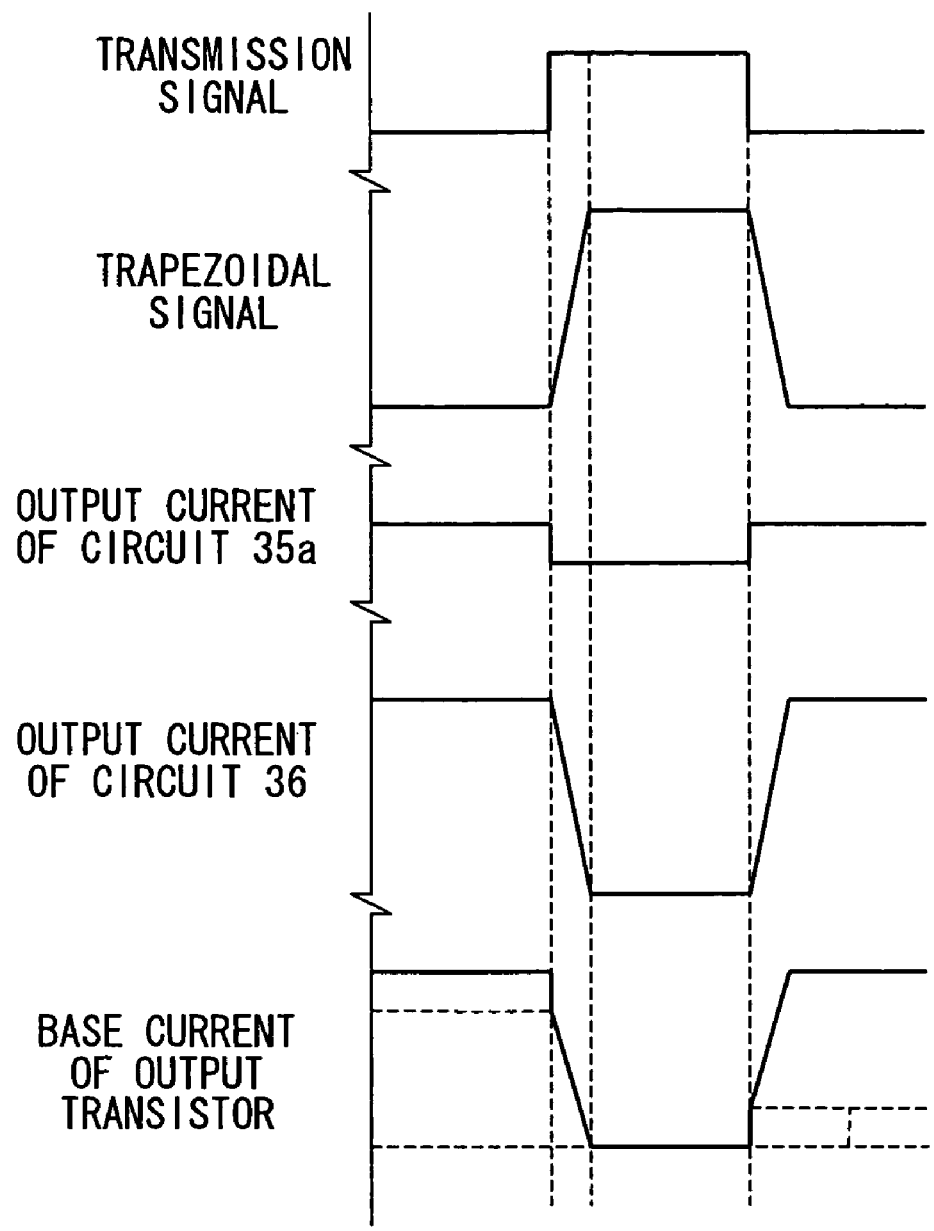
FIG. 4 is a timing diagram of signals at main portions of the transceiver circuit according to the second embodiment.

As shown in FIG. 4, the small amount of the constant current supplied by the constant current circuit 35a is stopped when the level of the transmission signal becomes high, so that the amount of the current supplied by the trapezoidal wave-form constant current circuit 36 changes in a similar wave-form to the reversal of the trapezoidal wave-form signal. Accordingly, as soon as the transmission signal rises up, the base current of the transistor Q10, the base current of the output transistor Q14 that flows through the transistor Q13 decreases by an amount of several μA before decreasing at a certain falling angle. When the base current of the output transistor Q14 is supplied again, it increases by an amount of several μA before increasing at a certain rising angle. This small amount of current is effective to transfer the output transistor Q14 from the saturation region thereof to the active region thereof without delay, or from the active region thereof to the saturation region thereof without delay. The output signal of the input/output terminal 31 has the same wave-form as the base current of the output transistor Q14.

Figure 5:
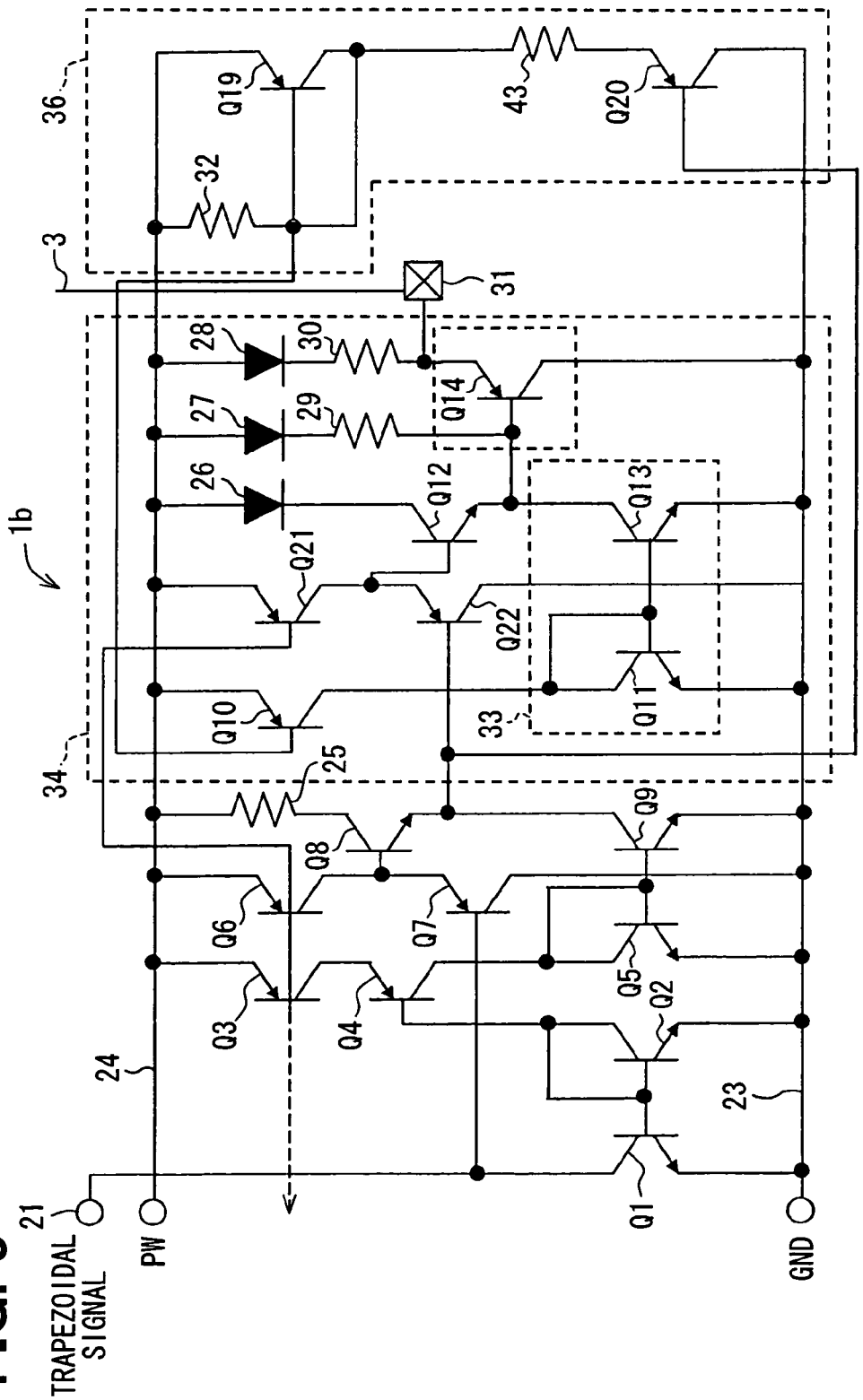
FIG. 5 is a circuit diagram of a transceiver IC of a transceiver circuit according to the third embodiment of the invention.
Figure 6:
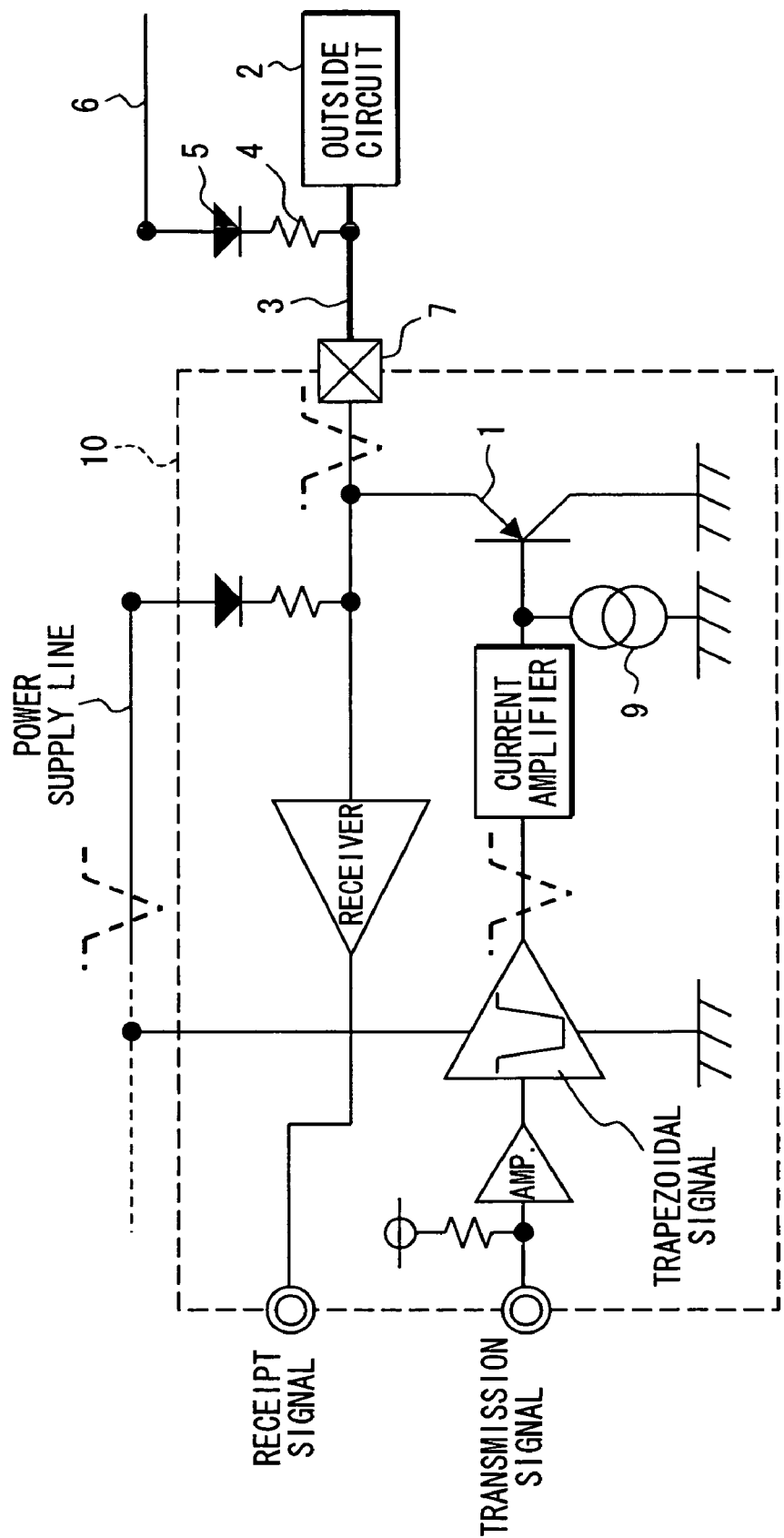
FIG. 6 is a schematic circuit diagram of a prior art transceiver IC.

A transceiver circuit for signal communication according to the third embodiment of the invention will be described with reference to FIG. 5.

The transceiver circuit includes a transceiver IC 1b, a communication line 3 and the common trapezoidal signal circuit 22.

The transceiver IC 1b is the same in structure as the second embodiment except that the constant current circuit 35a of the second embodiment is omitted. Therefore, the base current of the output transistor Q14 is the same as the output current of the trapezoidal wave-form constant current circuit 36 shown in FIG. 4. This transceiver circuit may be preferable if the delay time of the output transistor Q14 does not cause the communication speed a big trouble.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. For example, the bipolar transistors used in the above embodiments can be replaced with MOSFETs, and the MOSFET Q16 can be replaced with a bipolar transistor. Accordingly, the description of the present invention is to be regarded in an illustrative, rather than a restrictive, sense.

What is claimed is:

1. A transceiver circuit comprising:
    a communication line;
    a power source line;
    an output transistor having an emitter-collector path connected between the communication line and a ground and a base;
    a transmission signal terminal for inputting a transmission signal;
    a trapezoidal wave signal circuit for providing a trapezoidal signal in synchronism with the transmission signal;
    a driving circuit having an input terminal connected with the trapezoidal wave signal circuit and an output terminal connected with the base of the output transistor for driving the output transistor in response to the trapezoidal wave signal; and
    a control circuit, connected with the driving circuit and the transmission signal terminal, for controlling the driving circuit to turn off the output transistor when the level of the transmission signal is high.

2. A transceiver circuit as in claim 1, wherein the driving circuit comprises a current mirror circuit having a pair of transistors, one of which is connected to the base of the output transistor and the other of which is connected to the control circuit so that the one of the transistor turns off to turn off the output transistor when the control circuit controls the driving circuit.

3. A transceiver circuit as in claim 1, wherein the control circuit comprises a current mirror circuit having a pair of transistors and a switching transistor for switching on one of the pair of transistors when the level of the transmission signal is high.

4. A transceiver circuit as in claim 3, wherein the control circuit further comprises a circuit for supplying current to transfer the output transistor from a saturation region to an active region when it turns off and current to transfer the output transistor from the active region to the saturation region when it turns on.

* * * * *